United States Patent
Chen et al.

(10) Patent No.: US 7,633,797 B2
(45) Date of Patent: Dec. 15, 2009

(54) FLASH MEMORY AND METHOD FOR DETERMINING LOGIC STATES THEREOF

(75) Inventors: Chung-Kuang Chen, Pan Chiao (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 6 days.

(21) Appl. No.: 11/657,524

(22) Filed: Jan. 25, 2007

(65) Prior Publication Data
US 2008/0181010 A1 Jul. 31, 2008

(51) Int. Cl.
*G11C 16/04* (2006.01)
(52) U.S. Cl. ............................ 365/185.03; 365/189.09; 365/185.19; 365/185.2; 365/185.21; 365/185.22
(58) Field of Classification Search ............ 365/185.03, 365/189.09, 185.19, 185.2, 185.22, 185.21
See application file for complete search history.

(56) References Cited

U.S. PATENT DOCUMENTS

| 6,272,043 | B1 * | 8/2001 | Hollmer | 365/185.16 |
| 2005/0024967 | A1 * | 2/2005 | Matsuoka | 365/207 |
| 2006/0023502 | A1 * | 2/2006 | Cernea et al. | 365/185.02 |
| 2007/0014144 | A1 * | 1/2007 | Wicker | 365/148 |
| 2007/0109889 | A1 * | 5/2007 | Cernea et al. | 365/203 |
| 2008/0043521 | A1 * | 2/2008 | Liaw et al. | 365/163 |

FOREIGN PATENT DOCUMENTS

JP    11-066876    3/1999

* cited by examiner

*Primary Examiner*—Thong Q Le
(74) *Attorney, Agent, or Firm*—Rabin & Berdo, P.C.

(57) ABSTRACT

A method for determing the logic state of a memory cell of an array is provided. The array includes many word lines and bit lines. The method proceeds with the following steps. Firstly, a first voltage varing according to a sensing parasitic resistance of the memory cell is applied to the memory cell for a cell current. Next, a second voltage is applied to a reference cell corresponding to the memory cell for a reference current. Then, the cell current is compared with the reference current so as to determine the logic state of the memory cell.

23 Claims, 10 Drawing Sheets

FLASH MEMORY AND METHOD FOR DETERMINING LOGIC STATES THEREOF

BACKGROUND OF THE INVENTION

1. Field of the Invention

The invention relates in general to a flash memory and a method for determining logic states thereof, and more particularly to a flash memory capable of saving memory operating window and a method for determining logic states thereof.

2. Description of the Related Art

The technology of non-volatile memory has been widely applied in many fields including flash memory. The flash memory is used for the reading and writing of data. As the data stored in the flash memory are not maintained by power, the flash memory is widely applied in various types of data storage.

Referring to FIG. 1, a diagram of a conventional flash memory is shown. The flash memory 100 includes a number of memory cells M arranged in an array. Each of the memory cells M is enabled by a corresponding word line WL. When the flash memory 100 is read, programmed or erased, the bit line BL and the word line WL corresponding to the target memory cell M are enabled. A determination as to whether the bit line BL is electrically connected to the sense amplifier unit 102 or the ground is made by a select switch (not shown in the diagram).

After data are written into the flash memory 100, that is, after programming, the flash memory 100 needs to be verified to assure the accuracy of data writing. That is, whether the threshold voltage of the memory cell M is above the programming verification voltage is verified. If verification is applied to the memory cell M after programming, a verifying gate voltage is applied to the corresponding word line WL, and a drain voltage is applied to the drain of the memory cell M. At least one reference cell 103 is coupled to the sense amplifier 102 and the memory cells M, for outputting a reference current.

The sense amplifier 120 is for detecting the cell current of the memory cells M to ascertain whether the memory cells M succeeds in programming. The cell current detected by the sense amplifier unit 102 is smaller than the reference current implies that the threshold voltage of the memory cell M is larger than the threshold voltage of the reference cell, and the flash memory succeeds in programming. Thus, the threshold voltage of the reference cell is defined as programming verification voltage PV.

The threshold voltage of memory cells M refers to the threshold voltage of the memory cells M after manufacturing process, and is defined as the manufacturing process threshold voltage P_VT. The threshold voltage sensed by the sense amplifier 120 via the bit line BL is defined as the sensing threshold voltage S_VT. In the flash memory 100, the word line WL1 and the word line WLm are taken for example, however the example is non-limiting. The memory cells M corresponding to the word line WL1 have the same manufacturing process threshold voltage P_VT with the memory cells M corresponding to the word line WLm. However, as the bit lines BL are formed from a metal and buried diffusion region, the current sensing path of the sense amplifier unit 102 used for sensing the memory cells M corresponding to the word line WL1 has a relatively higher sensing parasitic resistance, while the current sensing path used for sensing the memory cells M corresponding to the word line WLm has a relatively lower sensing parasitic resistance. The effect caused by the sensing parasitic resistance is defined as array resistance effect (ARE).

Referring to FIG. 2, a partial architecture diagram of a conventional flash memory is shown. In the flash memory 100, memory cells M are divided into n groups, wherein n is a positive integer. Memory cells M of each group are connected electrically to the sense amplifier unit 102 via the corresponding group select switch 111~11m. The current sensing path of the sense amplifier 102 used for sensing the memory cell B is longer with a higher sensing parasitic resistance Rmbl. The current sensing path of the sense amplifier 102 used for sensing the memory cell A is shorter with a lower sensing parasitic resistance.

Referring to FIG. 3, a distribution diagram of the threshold voltage of memory cells in the wake of conventional programming verification is shown. Suppose the distribution of the process threshold voltage (S_VT) of the memory cells M corresponding to the word line WLm is the same as the distribution of the process threshold voltage (S_VT) of the memory cells M corresponding to the word line WL1. Distribution curve 302 shows the distribution of the sensing threshold voltage and process threshold voltage of the memory cells M corresponding to the word line WLm and sensed by the sense amplifier unit 102 prior to programming. Distribution curve 304 shows the distribution of the sensing threshold voltage of the memory cells M corresponding to the word line WL1 and sensed by the sense amplifier unit 102 prior to programming. Due to the influence of the sensing parasitic resistance, that is, the array resistance effect, the sensing threshold voltage distribution curve 304 more affected by the array resistance effect is more shifted to the right than the sensing threshold voltage distribution curve 302 is. Distribution curve 306 detected by sense amplifier is a combined distribution curve of the sensing threshold voltage distribution curve 302 and the sensing threshold voltage distribution curve 304. As the sensing threshold voltage distribution curve 302 is least affected by the sensing parasitic resistance, the sensing threshold voltage distribution curve 302 can be regarded as wider than the initial manufacturing process threshold voltage distribution P_VT.

During the programming verification, the sensing threshold voltage distribution of the memory cells M corresponding to the word line WL1 and the word line WLm and sensed by the sense amplifier unit 102 forms a distribution curve 308 which is above the programming verification voltage PV. It can be obtained from the sensing threshold voltage distribution curve 308 that the sensing threshold voltage distribution of the memory cells M corresponding to the word line WLm after programming forms a distribution curve 310, and the sensing threshold voltage distribution of the memory cells M corresponding to the word line WL1 after programming forms a distribution curve 312.

The difference between the upper limit of the sensing threshold voltage distribution curve 306 and the lower limit of the sensing threshold voltage distribution curve 308 is defined as the memory operating window S1, which is the actual operating window of the flash memory 100. During the programming of flash memory 100, the operating window provided to the memory cells M corresponding to the word line WL1 is the difference between the upper limit of the sensing threshold voltage distribution curve 204 and the lower limit of the sensing threshold voltage distribution curve 208 according to its S_VT distribution, that is the memory operating window S1. The first process threshold voltage difference D1 is the upper limit of the process threshold voltage distribution curve 302 and the lower limit of the process threshold voltage distribution curve 312. Actually, the first process threshold voltage difference D1 is equal to the memory operating window S1, so there is no waste in programming delta threshold voltage. Despite the threshold voltage sensed by the sense amplifier unit 102 is shifted, the actual programming is not affected.

However, the operating window for the programming of the memory cells M corresponding to the word line WLm is the difference between the upper limit of the sensing threshold voltage distribution curve 302 and the lower limit of the sensing threshold voltage distribution curve 310, and is defined as the second process threshold voltage difference D2. The second process threshold voltage difference D2 is larger than the memory operating window S1. That is, the operating window provided to the memory cells M corresponding to the word line WLm is larger than the memory operating window S1, therefore a total of (D2−S1) operating window is wasted. Consequently, the memory cells M corresponding to the word line WLm will have more program charge, and the programming uniformity of the flash memory 100 will decrease.

Besides, after data are erased from the flash memory 100, an erasing verification is applied to the flash memory 100 to assure the accuracy of data erasing. That is, whether the threshold voltage of the memory cells M is below the erasing verification voltage is verified. Similarly, after data reading from the flash memory 100, a verification is also applied. Likewise, the operating window provided to the memory cells M corresponding to the word line WLm is larger than the memory operating window. Consequently, the memory cells M corresponding to the word line WLn will have more charge, and the uniformity of the flash memory 100 will decrease.

SUMMARY OF THE INVENTION

It is therefore an object of the invention to provide a method for determining logic states of a flash memory. The method adopts different verifying voltages for reading, programming and erasing, such that the memory operating window and the threshold voltage difference of the memory cells of the flash memory are the same after verification, thereby saving memory operating window and increasing flash memory uniformity.

The invention achieves the above object by providing a method for determining the logic state of a memory cell of an array. The array includes many word lines and bit lines. The method proceeds with the following steps. Firstly, a first voltage varying according to a sensing parasitic resistance of the memory cell is applied to the memory cell for a cell current. Next, a second voltage is applied to a reference cell corresponding to the memory cell for a reference current. Then, the cell current is compared with the reference current so as to determine the logic state of the memory cell.

The invention achieves another object by providing a method for determining the logic state of a memory cell of an array. The array includes many word lines and bit lines. The method proceeds with the following steps. Firstly, a first voltage is applied to the cell for a cell current. Next, a second voltage varing according to a sensing parasitic resistance of said memory cell is applied to a reference cell corresponding to the memory cell for a reference current. Then, the cell current is compared with the reference current to determine the logic state of said memory cell.

The invention achieves another object by providing a method for determining a logic state of a memory cell of an array. The array includes many word lines and bit lines. The method proceeds with the following steps. Firstly, a first voltage is applied to the memory cell for a cell current. Nest, a second voltage is applied to a reference cell corresponding to the memory cell for a reference current. Then, the cell current is compared with the reference current at a time when the cell current reach a predetermined value, to determine the logic state of said memory cell. The time varies according to a sensing parasitic resistance of said memory cell.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a method for determining logic states of a flash memory. Different verifying condition for reading, programming and erasing are adopted according to the sensing parasitic resistance corresponding to the memory cell, such that the memory operating window and the threshold voltage difference of the memory cells of the flash memory are the same after verification.

The flash memory 100 arranged in a virtual ground array is a single level cell (SLC) memory or a multi-level cell (MLC) memory. The sense amplifier unit 102 is actually composed of many sense amplifiers. The memory cells M are divided into many groups. The memory cells M belong to the same group have sensing parasitic resistance within a predetermined range.

Figure 1:
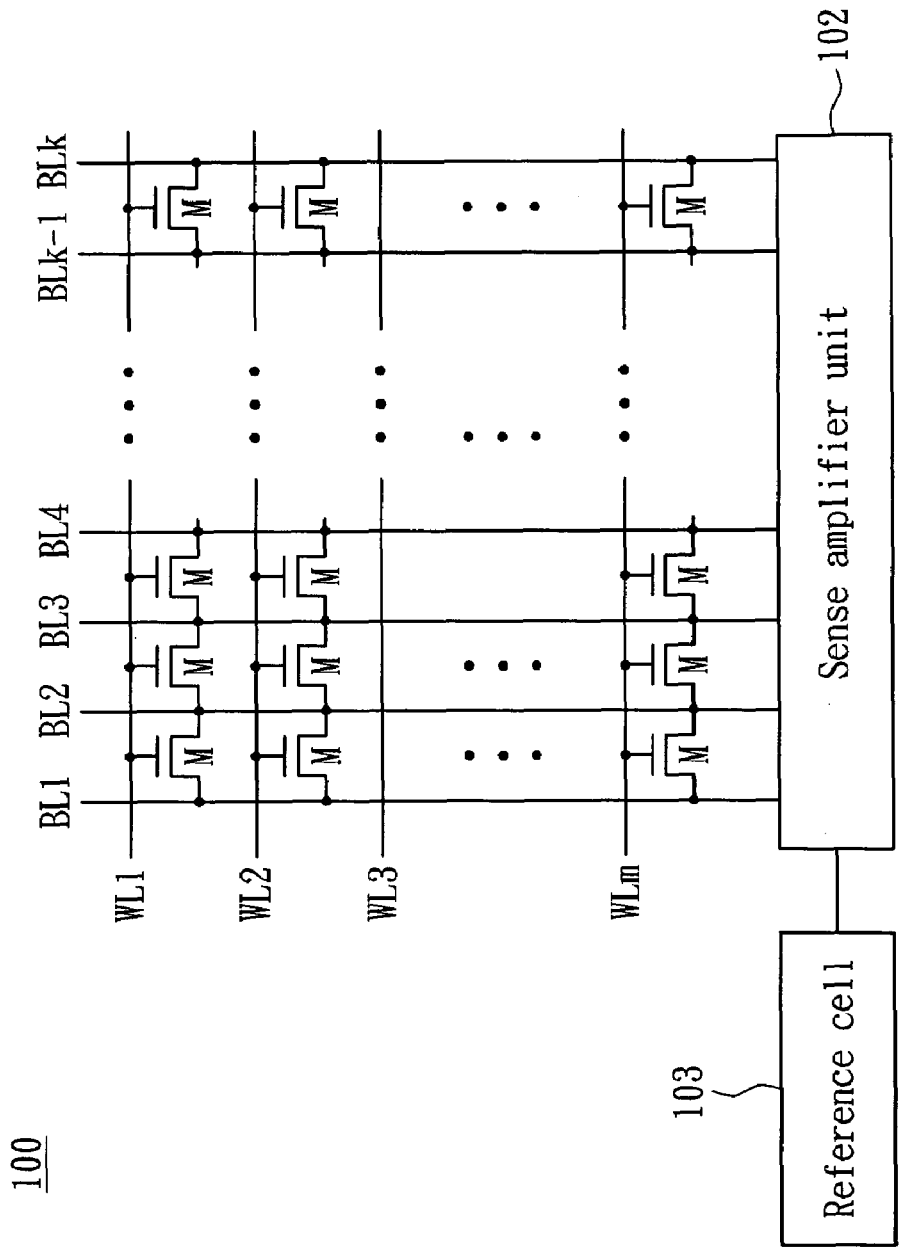
FIG. 1 is a diagram of a conventional flash memory.
Figure 2:
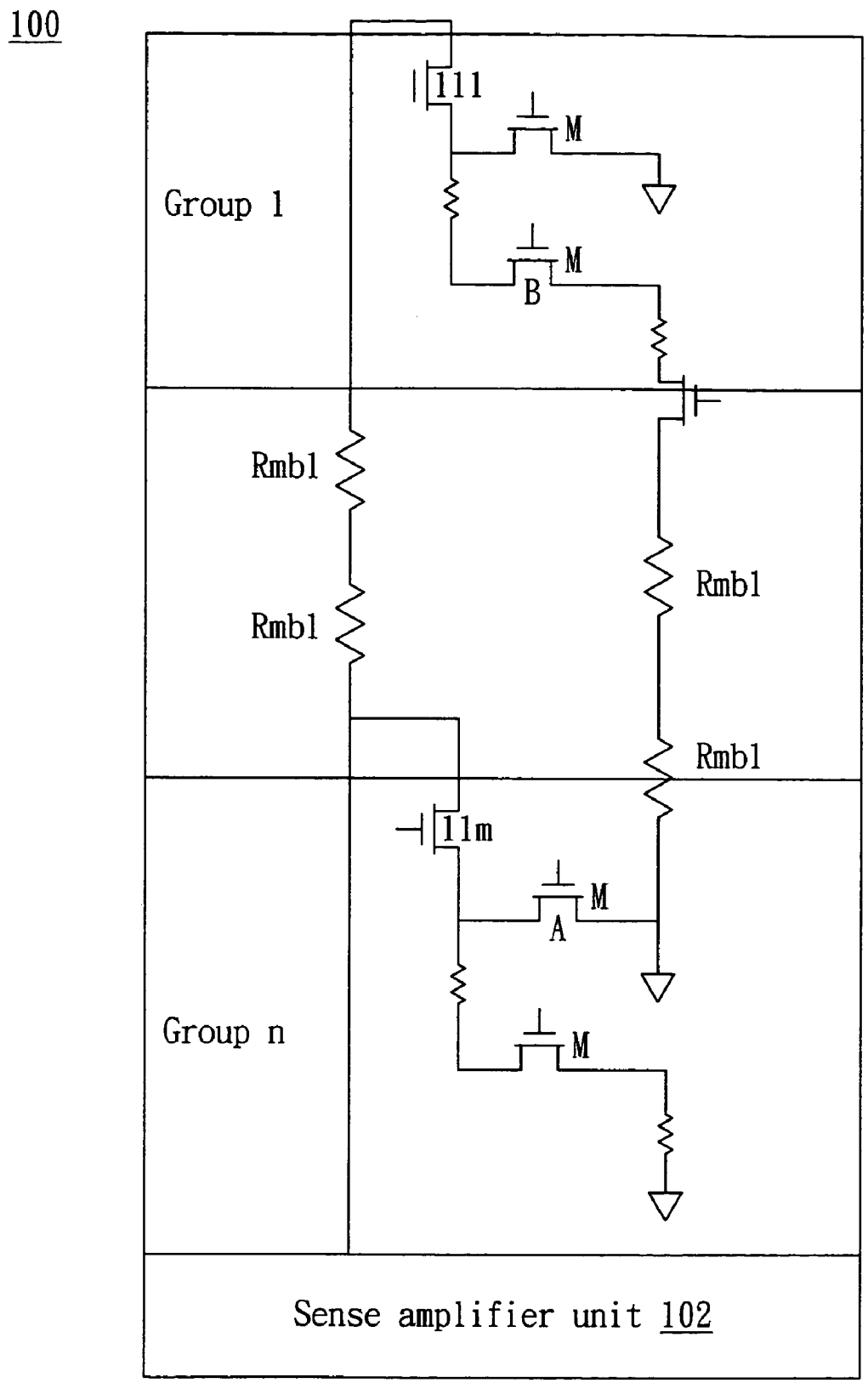
FIG. 2 is a partial architecture diagram of a conventional flash memory is shown.
Figure 3:
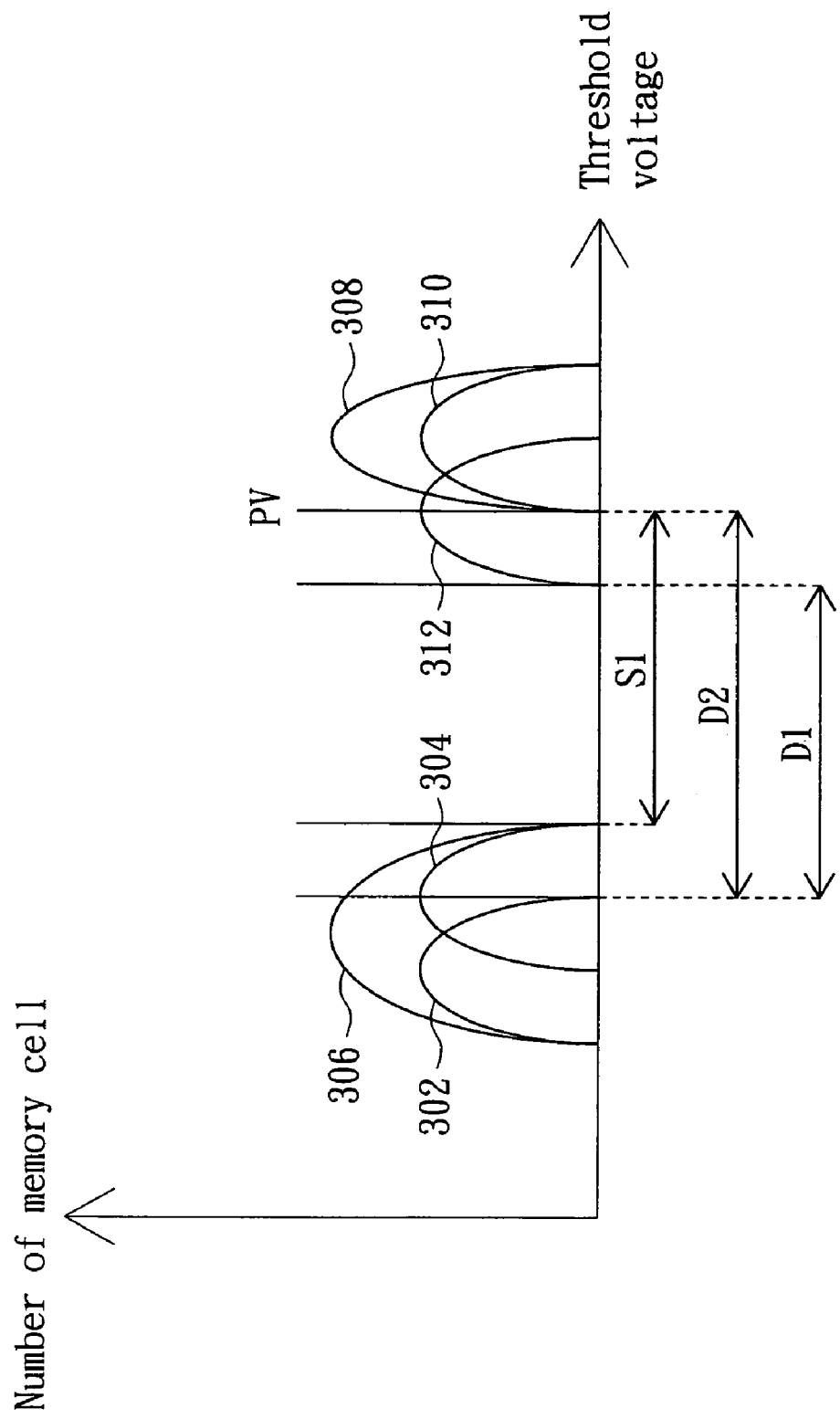
FIG. 3 is a distribution diagram of the threshold voltage of memory cells in the wake of conventional programming verification.
Figure 4:
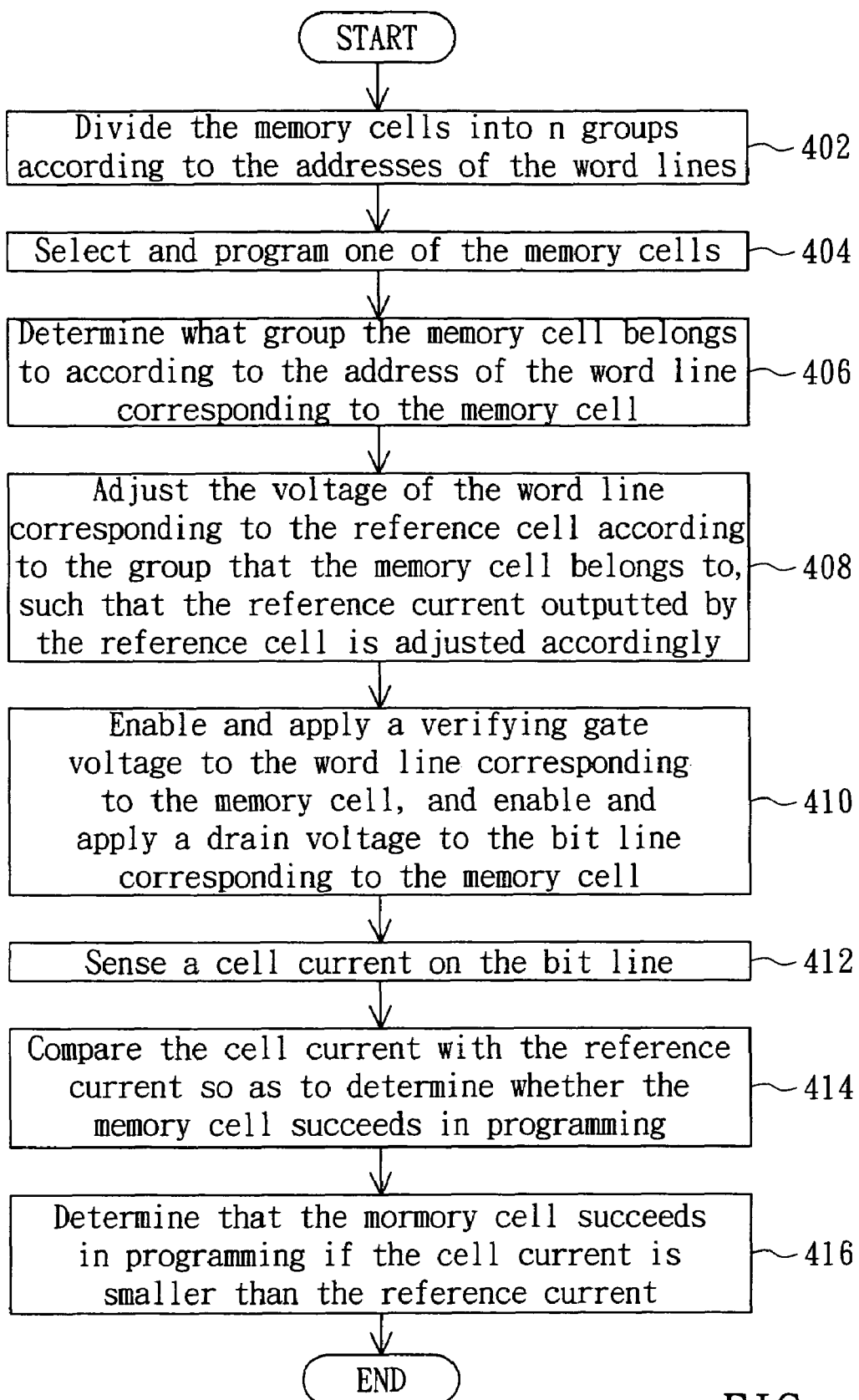
FIG. 4 is a flowchart of a verification method for the programming of flash memory according to a preferred embodiment of the invention.

Referring to FIG. 4, a flowchart of a verification method for the programming of flash memory according to a preferred embodiment of the invention is shown. The method of the present embodiment of the invention can be used for determining a logic state of a memory cell of the array in the flash memory 100 of FIG. 1 for example. At first, the method begins at step 402, the memory cells M are divided into n groups according to the addresses of the word lines WL1~WLm, wherein n is a positive integer. For example, the memory cells M are divided into 2 groups, wherein the memory cells M corresponding to the word lines WL1~WL (m/2) belong to the first group, and the memory cells M corresponding to the word lines WL (1+m/2)~WLm belong to the second group. However, the number of groups is not limited to 2 groups. The memory cells belong to the same group have sensing parasitic resistance within a predetermined range.

Then, the method proceeds to step 404, one of the memory cells M is selected and programmed. Next, the method proceeds to step 406, what group the memory cell M belongs to is determined according to the address of the word line corresponding to the memory cell M. Thereafter, the method proceeds to step 408, the voltage of the word line corresponding to the reference cell is adjusted according to the address of the word line corresponding to the memory cell M, that is to the group that the memory cell M belongs to, such that the reference current outputted by the reference cell is adjusted accordingly.

Then, the method proceeds to step 410, a verifying gate voltage is enabled and applied to the word line corresponding to the memory cell M, and a drain voltage is enabled and applied to the bit line corresponding to the memory cell M. The verifying gate voltage varies according to the sensing parasitic resistance of the memory cell. The cell current of the memory cell reaches a predetermined value. After that, the method proceeds to step 412, a cell current on the bit line is sensed. Thereafter, the method proceeds to step 414, the cell current is compared with the reference current so as to determine whether the memory cell M succeeds in programming. Then, the method proceeds to step 416, the memory cell M succeeds in programming if the cell current is smaller than the reference current. The cell current is a drain current or a source current of the memory cell M.

In the verification method for the programming of flash memory, step 408 is for adjusting the programming verification voltage PV of the flash memory. If the sensing parasitic resistance of the memory cell M is smaller, the reference current outputted by the reference cell is increased. Thus, the cell current of the memory cell M would easily be smaller than the reference current, that is, the programming verification voltage PV of the memory cell M during programming is smaller, and is referred as the first programming verification voltage PV1. To the contrary, if the sensing parasitic resistance of the memory cell M is larger, the programming verification voltage PV of the memory cell M is larger as well, and is referred as the second programming verification voltage PV2.

Figure 5:
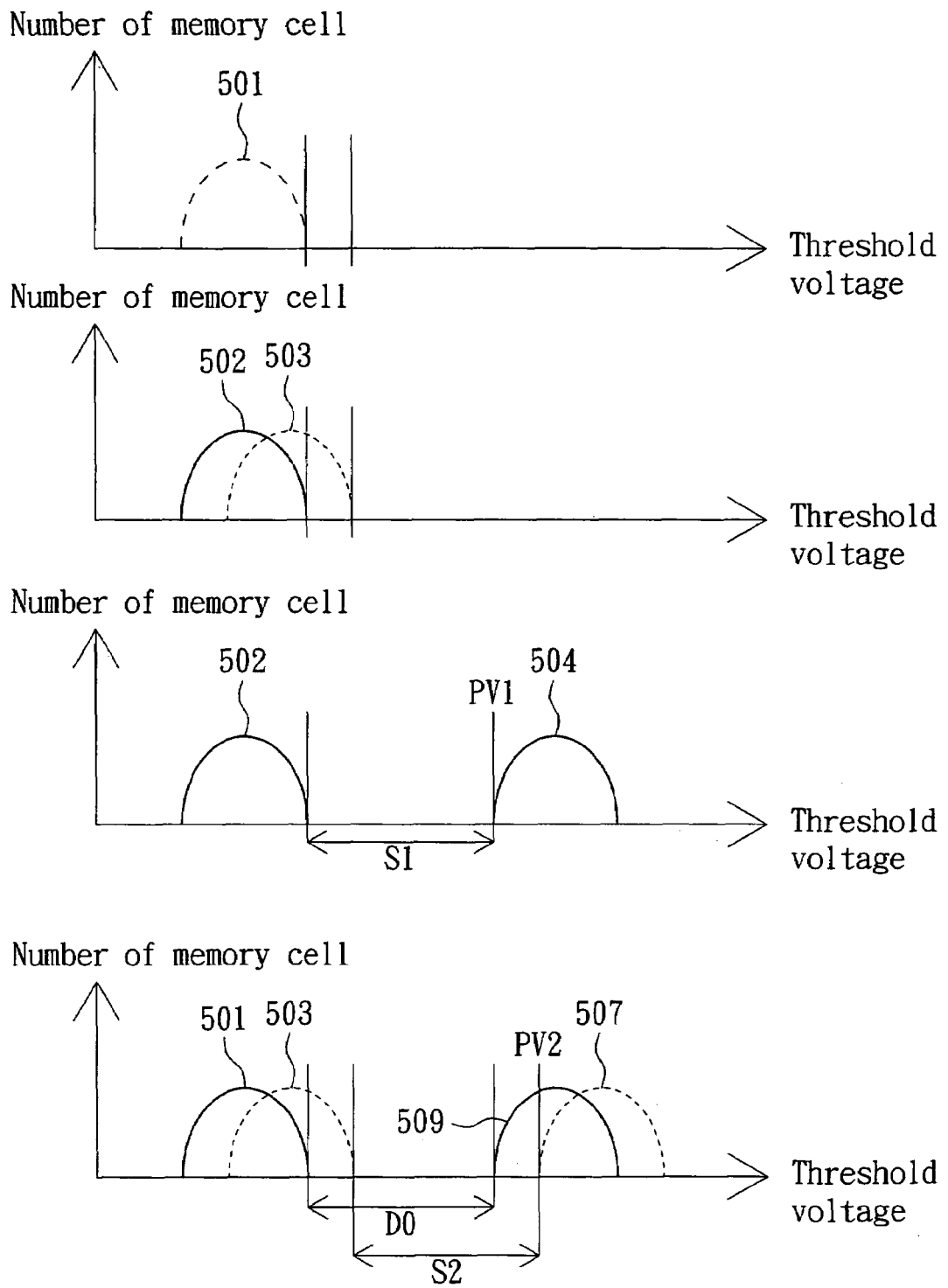
FIG. 5 is a distribution diagram of the threshold voltage of a verification method for the programming of flash memory according to a preferred embodiment of the invention.

Referring to FIG. 5, a distribution diagram of the threshold voltage of a verification method for the programming of flash memory according to a preferred embodiment of the invention is shown. In FIG. 5, the flash memory 100 is exemplified by an SLC memory, and a number of memory cells M are divided into 2 groups, but it is not limited thereto. Distribution curve 501 shows the distribution of the threshold voltage of a number of memory cells M of the flash memory 100 during manufacturing process. Distribution curve 502 shows the distribution of the sensing threshold voltage of the group of memory cells M with smaller sensing parasitic resistance, while distribution curve 503 shows the distribution of the sensing threshold voltage of the group of memory cells M with larger sensing parasitic resistance, wherein the sensing threshold voltage distribution 502 is almost equal to the distribution curve 501 of the manufacturing process threshold voltage, the sensing threshold voltage distribution curve 503 is more shifted to the right than the sensing threshold voltage distribution curve 502.

If the memory cells M belongs to the group with smaller sensing parasitic resistance, then the first programming verification voltage PV1 is adopted during the verification of programming. As indicated in FIG. 5, distribution curve 504 shows the distribution of the sensing threshold voltage of the memory cells M after programming, wherein the first memory operating window S1 is equal to the actual threshold voltage difference D0.

If the memory cells M belongs to the group with larger sensing parasitic resistance, then the first programming verification voltage PV2 is adopted during the verification of programming. As indicated in FIG. 5, distribution curve 507 shows the distribution of the sensing threshold voltage of the memory cells M after programming, while distribution curve 509 shows the distribution of the manufacturing process threshold voltage of the memory cells M after programming. Despite the sensing threshold voltage distribution 507 is shifted, however, the difference between the sensing threshold voltage distribution curve 507 and the sensing threshold voltage distribution curve 503 is equal to the threshold voltage difference D0, that is, the second memory operating window S2 has the same shift, so the actual programming is not affected.

Figure 6:
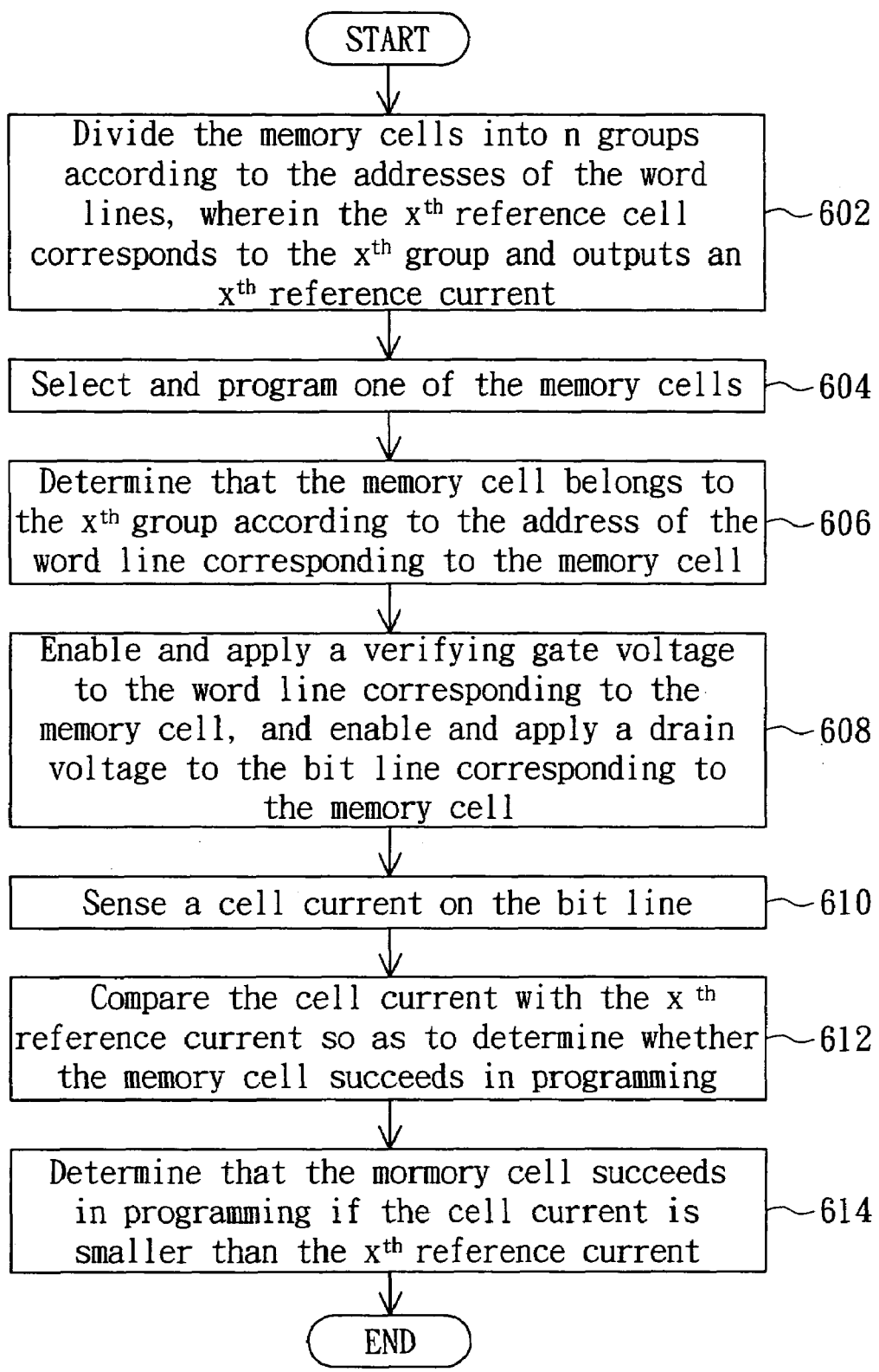
FIG. 6 is another example of a flowchart of a verification method for the programming of flash memory according to a preferred embodiment of the invention.

The invention can also use another method to adjust the programming verification voltage PV of the flash memory. Referring to FIG. 6, another example of a flowchart of a verification method for the programming of flash memory according to a preferred embodiment of the invention is shown. The method can be used for determining a logic state of a memory cell of the array in the flash memory 100 of FIG. 1. There are n reference cells coupled to the memory cells M, wherein n is a positive integer. At first, the method begins at step 602, the memory cells M are divided into n groups according to the addresses of the word lines WL1~WLm, wherein the $x^{th}$ reference cell corresponds to the $x^{th}$ group and outputs an $x^{th}$ reference current, x is a positive integer smaller than or equal to n. The $x^{th}$ reference current increases as the sensing parasitic resistance of the $x^{th}$ group decreases. That is, the $x^{th}$ reference current varies inversely according to the sensing parasitic resistance of the memory cell.

Then, the method proceeds to step 604, one of the memory cells M is selected and programmed. Next, the method proceeds to step 606, what group the memory cell M belongs to is determined according to the address of the word line corresponding to the memory cell. For example, the memory cell M is determined to belong to the $x^{th}$ group. Then, the method proceeds to step 608, a verifying gate voltage is enabled and applied to the word line corresponding to the memory cell M, and a drain voltage is enabled and applied to the bit line corresponding to the memory cell M.

After that, the method proceeds to step 610, a cell current on the bit line is sensed. The cell current may be a drain current or a source current of the memory cell M. As the memory cell M is determined to belong to the $x^{th}$ group in step 612, the cell current is compared with the $x^{th}$ reference current so as to determine whether the memory cell M succeeds in programming. Then, the method proceeds to step 614, the memory cell M succeeds in programming if the cell current is smaller than the $x^{th}$ reference current. Besides, the distribution of the threshold voltage of the flash memory using the above verification method for programming is the same with FIG. 5, and is not repeated here.

Figure 7:
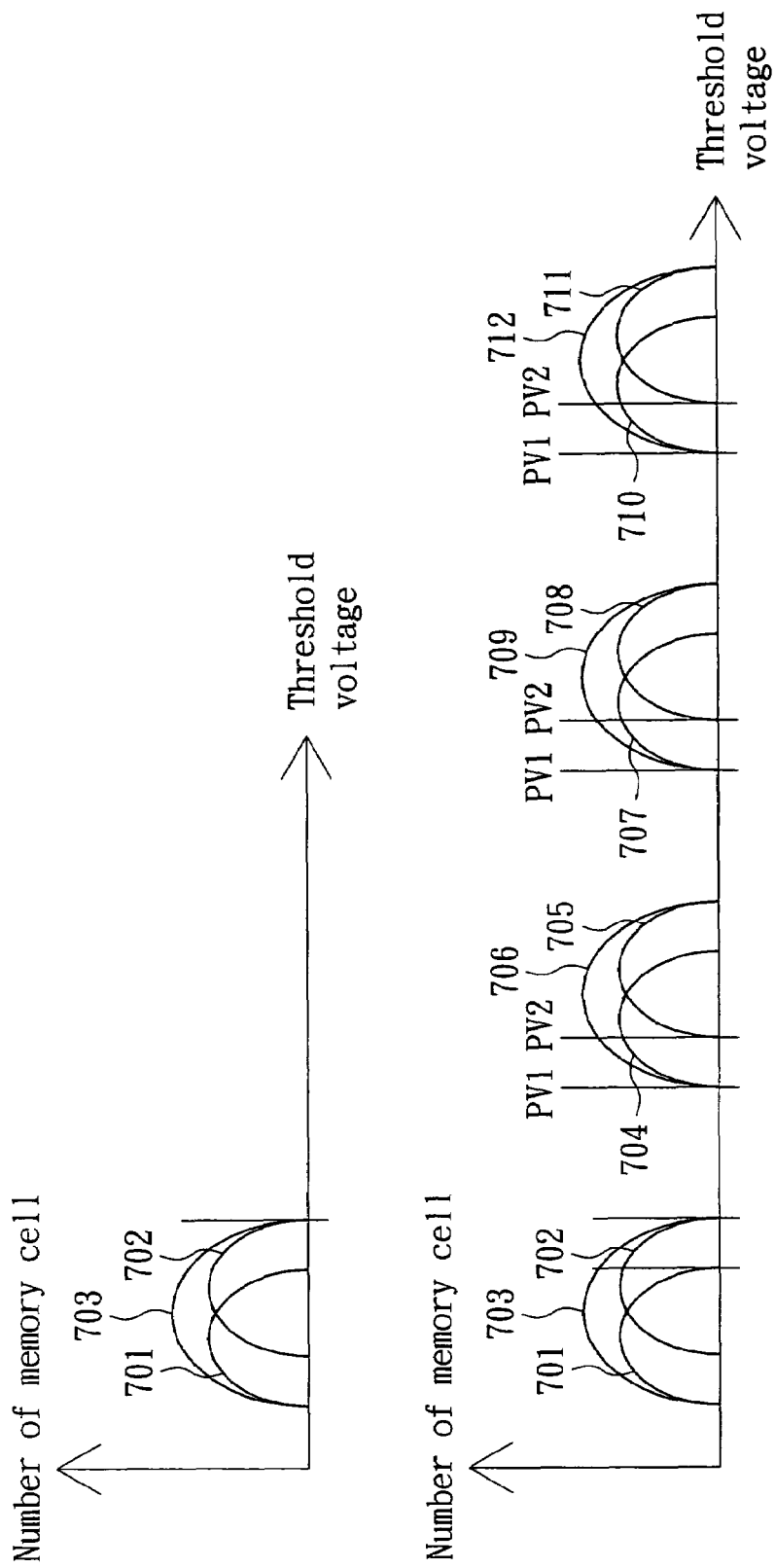
FIG. 7 is a distribution diagram of the threshold voltage of a verification method for the programming of multi-level cell flash memory according to a preferred embodiment of the invention.

The verification method for the programming of flash memory of the invention is used in SLC flash memory as well as MLC flash memory. In the MLC flash memory, only the two lower levels are affected by the sensing parasitic resistance. The distribution diagram of the threshold voltage is exemplified below. Referring to FIG. 7, a distribution diagram of the threshold voltage of a verification method for the programming of multi-level cell flash memory according to a preferred embodiment of the invention is shown. Distribution curves 701, 704, 707 and 710 show the distribution of the sensing threshold voltage of the memory cells with smaller sensing parasitic resistances. Distribution curves 702, 705, 708 and 711 show the distribution of the sensing threshold voltage of the memory cells with larger sensing parasitic resistances. Distribution curves 703, 706, 709 and 712 show the distribution of the sensing threshold voltage distribution of the memory cells of combined groups. As the first programming verification voltage PV1 and the second programming verification voltage PV2 are adopted, the memory operating window will be equal to the actual threshold voltage difference, thus the actual programming is not affected.

Likewise, the verification method for the erasing of flash memory can use the same method, that is, different erasing verification voltages are used according to the sensing parasitic resistance. The flowchart of FIG. 4 and FIG. 6 of the invention can also be used in the verification method for the erasing of flash memory. The difference between FIG. 4 and FIG. 6 is that in step 416, the memory cell M succeeds in erasing if the cell current is larger than the reference current, and in step 614, the memory cell succeeds in erasing if the cell current is larger than the $x^{th}$ reference current.

Figure 8:
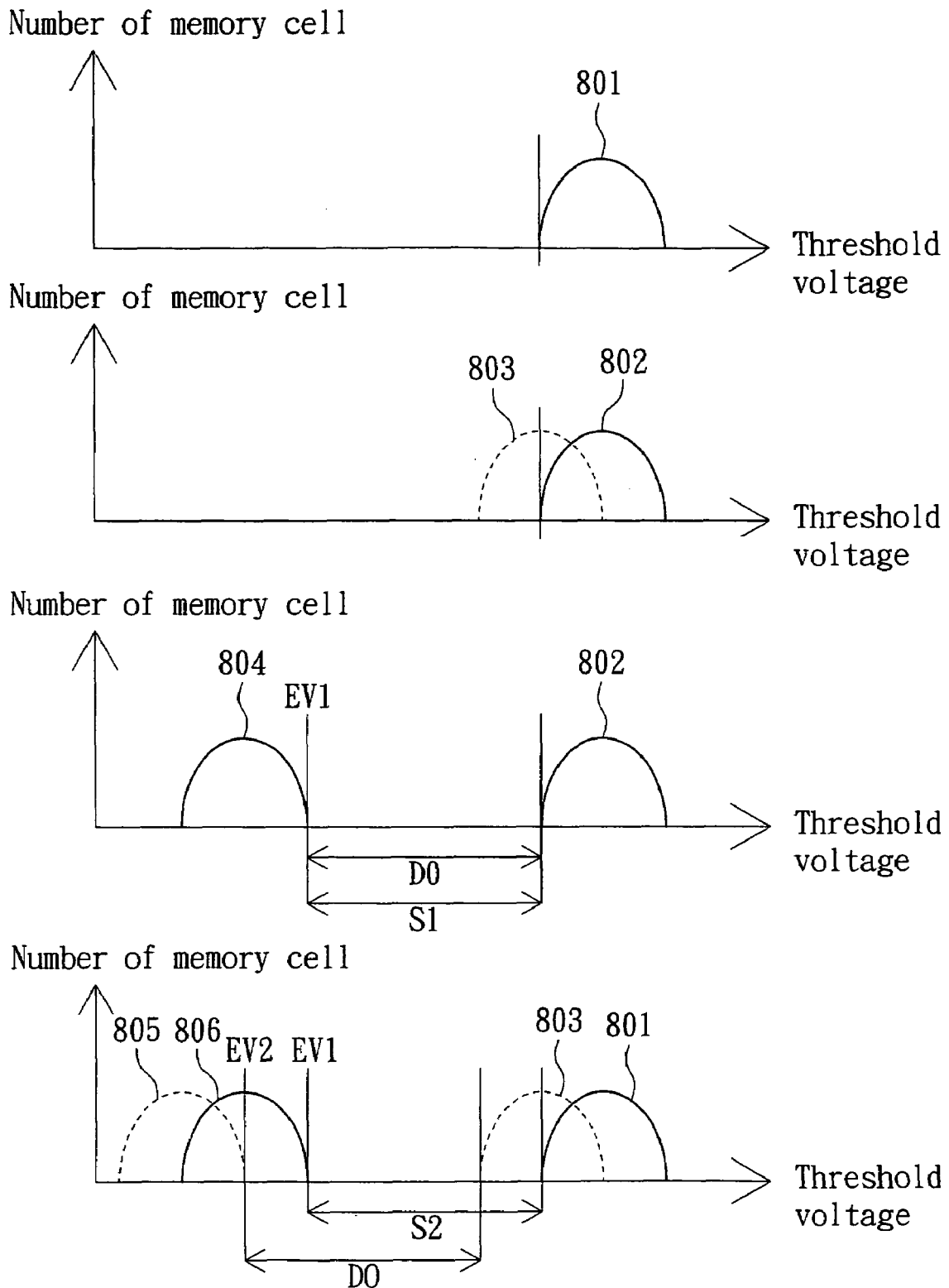
FIG. 8 is a distribution diagram of the threshold voltage of a verification method for the erasing of flash memory according to a preferred embodiment of the invention.

Referring to FIG. 8, a distribution diagram of the threshold voltage of a verification method for the erasing of flash memory according to a preferred embodiment of the invention is shown. In FIG. 8, the flash memory 100 is exemplified by an SLC memory, and the memory cells M are divided into 2 groups, but it is not limited thereto. Distribution curve 801 shows the distribution of the sensing threshold voltage of the memory cells M of the flash memory 100 after a conventional program design. Distribution curve 802 shows the distribution of the manufacturing process threshold voltage of the memory cells with smaller sensing parasitic resistance, while distribution curve 803 shows the distribution of the sensing threshold voltage of the memory cells with larger sensing parasitic resistance, wherein the manufacturing process threshold voltage distribution curve 802 is almost equal to the distribution curve 801 of the sensing threshold voltage, the sensing threshold voltage distribution curve 803 is more shifted to the left than the manufacturing process threshold voltage distribution curve 802.

If the memory cells M belongs to the group with smaller sensing parasitic resistance, then the first erasing verification voltage EV1 is adopted during the verification of erasing. As indicated in FIG. 8, distribution curve 804 shows the distribution of the sensing threshold voltage of the memory cells M after erasing, wherein the first memory operating window S1 is equal to the actual threshold voltage difference D0.

If the memory cells M belongs to the group with larger sensing parasitic resistance, then the second erasing verification voltage EV2 is adopted during the verification of erasing. As indicated in FIG. 8, distribution curve 805 shows the distribution of the sensing threshold voltage of the memory cells M after erasing, while distribution curve 806 shows the distribution of the actual manufacturing process threshold voltage of the memory cells M after erasing. Despite the sensing threshold voltage distribution 805 is shifted, however, the difference between the sensing threshold voltage distribution curve 805 and the sensing threshold voltage distribution curve 801 S2 is equal to the threshold voltage difference D0, that is, the second memory operating window S2 has the same shift, thus the actual programming is not affected.

Figure 9:
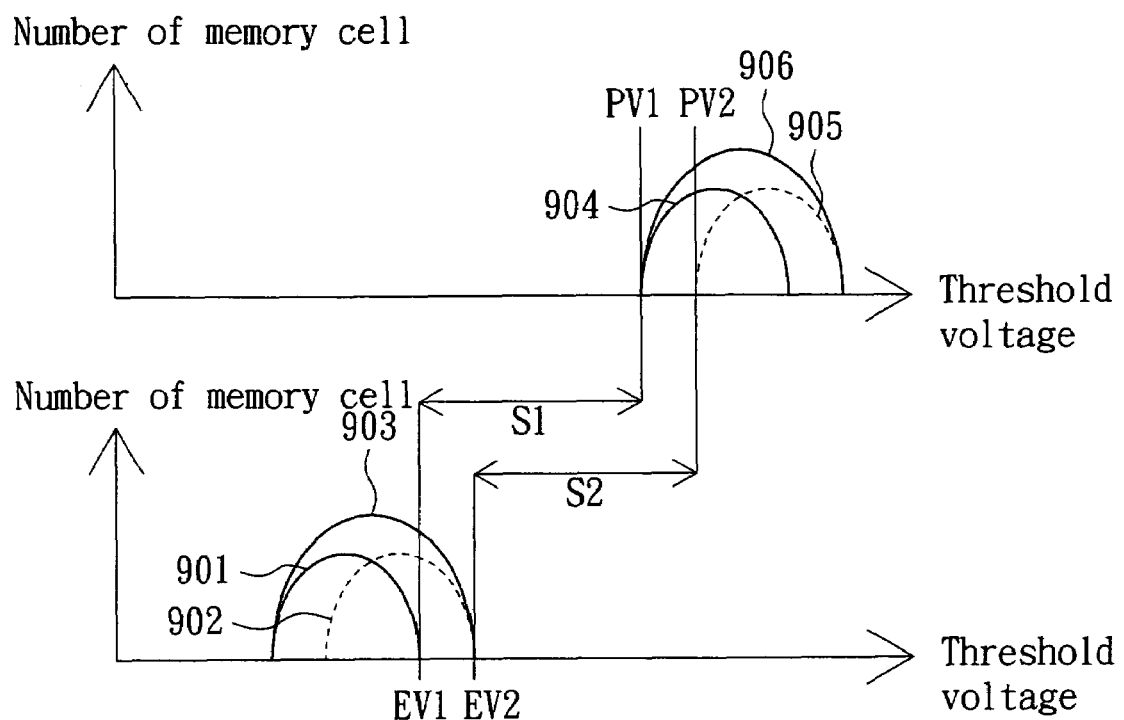
FIG. 9 is another example of a distribution diagram of the threshold voltage of a flash memory according to a preferred embodiment of the invention.

The verification method for the programming and the erasing of flash memory disclosed in the above embodiments can also be used in the flash memory at the same time for enabling the flash memory to have the same memory operating window and threshold voltage difference. Referring to FIG. 9, another example of a distribution diagram of the threshold voltage of a flash memory according to a preferred embodiment of the invention is shown. The first memory operating window S1 between the sensing threshold voltage distribution 901 and the sensing threshold voltage distribution 904 is equal to the second memory operating window S2 between the sensing threshold voltage distribution 902 and the sensing threshold voltage distribution 905, therefore no bias occurs.

Figure 10:
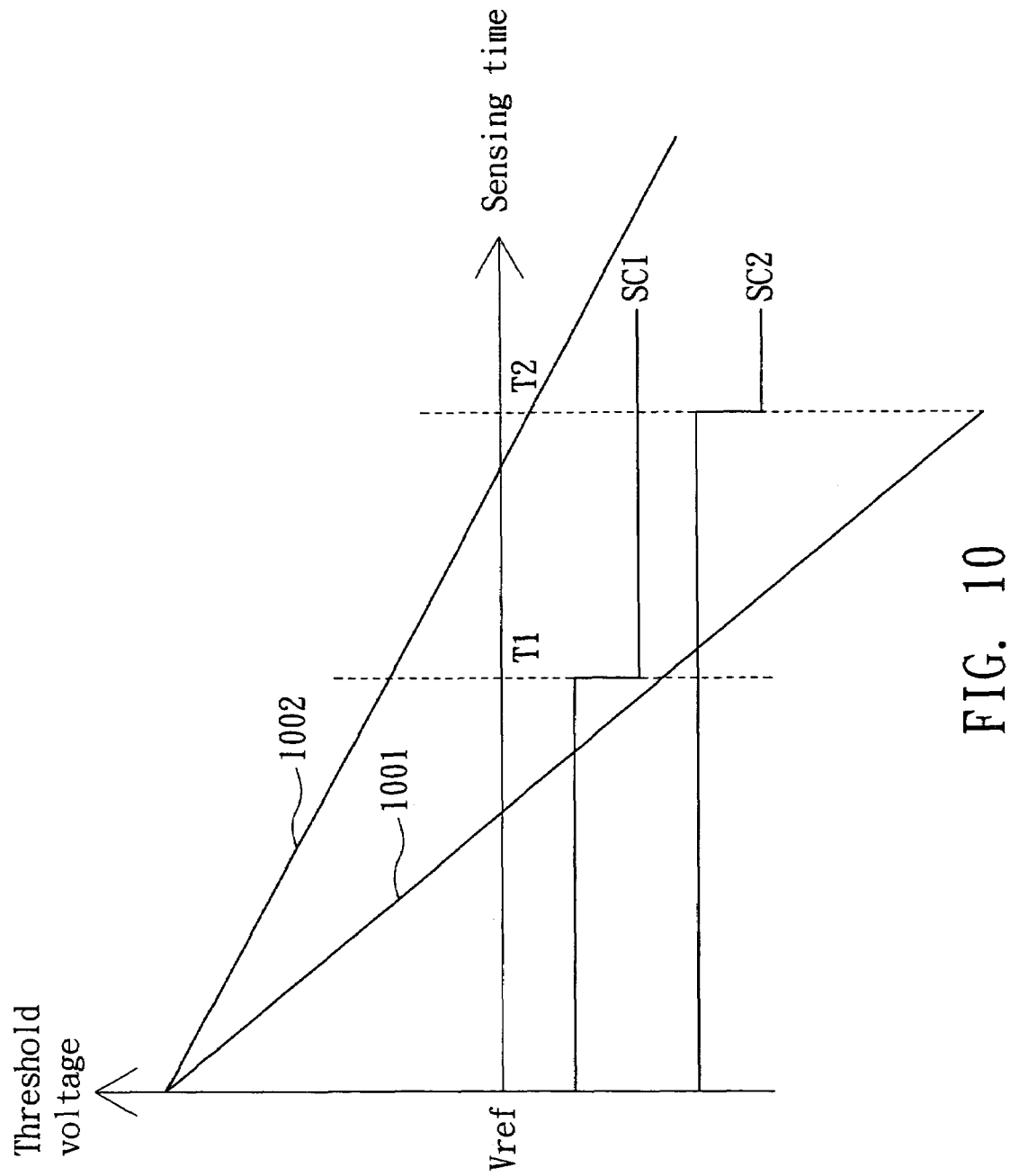
FIG. 10 is a logic state diagram of the memory cell according to a preferred embodiment of the invention.

The verification method for the programming and the erasing of flash memory menthioned above is substantially used to adjust the reference current outputted from the reference cell or the cell current outputted form the memory cell according to the sensing parasitic resistance corresponding to the memory cell to deteremine the logic state of the memory cell. In addition, the logic state of the memory cell may be determined by adjusting the sensing time of the cell current. FIG. 10 is a logic state diagram of the memory cell according to a preferred embodiment of the invention. Referring to FIG. 10, curve 1001 is the curve of threshold voltage in respect to sensing time of the memory cell M with the cell current $I_1$. Curve 1002 is the curve of threshold voltage in respect to sensing time of the memory cell M with the cell current 12. $V_{ref}$ is a reference threshold voltage. When the threshold voltage of the memory cell M is larger than the reference threshold voltage $V_{ref}$, the data stored in the memory cell M is "0", otherwise the data is "1". SC1 and SC2 are sensing time curves. When the voltage level of the sensing time curves SC1 or SC2 changes from a high level to a low level, the sensing time is finished and the data stored in the memory cell M is latched.

In FIG. 10, the threshold voltage of the curve 1001 corresponding to the sensing time curve SC1 is less than the reference threshold voltage $V_{ref}$. The memory cell M corresponding to the curve 1001 stores "1". The threshold voltage of the curve 1002 corresponding to the sensing time curve SC1 is larger than the reference threshold voltage $V_{ref}$. The memory cell M corresponding to the curve 1002 stores "0". Adjust the sensing time curve SC1 to the sensing time curve SC2. The threshold voltage of the curve 1001 corresponding to the sensing time curve SC2 is less than the reference threshold voltage $V_{ref}$. The memory cell M corresponding to the curve 1001 stores "1". The threshold voltage of the curve 1002 corresponding to the sensing time curve SC2 is less than the reference threshold voltage $V_{ref}$. The memory cell M corresponding to the curve 1002 stores "1". Thus, the logic state of the memory cell can be determined by adjusting the sensing time.

According to the method for determining logic states of a flash memory disclosed in above embodiment of the invention, different verifying conditions for programming and erasing are adopted according to the sensing parasitic resistances corresponding to the memory cells, such that the memory operating window and the threshold voltage difference of the memory cells of the flash memory are the same after verification, lest practical operation might be affected and the logic state of the memory cells might be determined. Meanwhile, the flash memory has better uniformity after programming and erasing.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for determining a logic state of a memory cell of an array, wherein the array comprises a plurality of word lines and bit lines, the method comprising:
    applying a first voltage to the memory cell for a cell current, wherein the first voltage varies according to a sensing parasitic resistance of the memory cell;
    applying a second voltage to a reference cell corresponding to the memory cell for a reference current; and
    comparing the cell current with the reference current so as to determine the logic state of the memory cell.

2. The method for determining the logic state of said memory cell of said array according to claim 1, wherein the logic state is used to verify a programming result.

3. The method for determining the logic state of said memory cell of said array according to claim 1, wherein the logic state is used to verify an erasing result.

4. The method for determining the logic state of said memory cell of said array according to claim 1, wherein the logic state is used to determine a read value of said memory cell.

5. The method for determining the logic state of said memory cell of said array according to claim 1, wherein the first voltage is applied to a word line of said memory cell for said cell current.

6. The method for determining the logic state of said memory cell of said array according to claim 1, wherein the first voltage is applied to a drain side of said memory cell for said cell current.

7. The method for determining the logic state of said memory cell of said array according to claim 1, wherein the first voltage is applied to a source side of said memory cell for said cell current.

8. The method for determining the logic state of said memory cell of said array according to claim 1, wherein the first voltage is applied to a bulk side of said cell for said cell current.

9. The method for determining the logic state of said memory cell of said array according to claim 1, further comprising:
    adjusting a sensing time.

10. A method for determining a logic state of a memory cell of an array, wherein the array comprises a plurality of word lines and bit lines, the method comprising:
    applying a first voltage to the cell for a cell current;
    applying a second voltage to a reference cell corresponding to the memory cell for a reference current, wherein the second voltage varies according to a sensing parasitic resistance of said memory cell; and
    comparing the cell current with the reference current to determine the logic state of said memory cell.

11. The method for determining the logic state of said memory cell of said array according to claim 10, wherein the logic state is used to verify a programming result.

12. The method for determining the logic state of said memory cell of said array according to claim 10, wherein the logic state is used to verify an erasing result.

13. The method for determining the logic state of said memory cell of said array according to claim 10, wherein the logic state is used to determine a read value of said memory cell.

14. The method for determining the logic state of said memory cell of said array according to claim 10, wherein the second voltage is applied to a word line of said reference cell for said reference current.

15. The method for determining the logic state of said memory cell of said array according to claim 10, wherein the second voltage is applied to a drain side of said reference cell for said reference current.

16. The method for determining the logic state of said memory cell of said array according to claim 10, wherein the second voltage is applied to a source side of said reference cell for said reference current.

17. The method for determining the logic state of said memory cell of said array according to claim 10, wherein the second voltage is applied to a bulk side of said reference cell for said reference current.

18. The method for determining the logic state of said memory cell of said array according to claim 10, further comprising:
    adjusting a sensing time.

19. A method for determining a logic state of a memory cell of an array, wherein the array comprises a plurality of word lines and bit lines, the method comprising:
    applying a first voltage to the memory cell for a cell current;
    applying a second voltage to a reference cell corresponding to the memory cell for a reference current; and
    comparing the cell current with the reference current at a time when the cell current reaches a predetermined value, to determine the logic state of said memory cell;
    wherein the time varies according to a sensing parasitic resistance of said memory cell.

20. The method for determining the logic state of the memory cell of the array according to claim 19, wherein the logic state is used to verify a programming result.

21. The method for determining the logic state of the memory cell of the array according to claim 19, wherein the logic state is used to verify an erasing result.

22. The method for determining the logic state of the memory cell of the array according to claim 19, wherein the logic state is used to determine a read value of the memory cell.

23. The method for determining the logic state of the memory cell of the array according to claim 19, further comprising:
    adjusting a sensing time.

* * * * *